United States Patent
Lee et al.

(10) Patent No.: US 7,219,274 B2
(45) Date of Patent: May 15, 2007

(54) MEMORY MODULE AND METHOD OF TESTING THE SAME

(75) Inventors: Jung-Bae Lee, Yongin-si (KR); Hoe-Ju Chung, Yongin-si (KR); Byung-Se So, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 323 days.

(21) Appl. No.: 10/831,702

(22) Filed: Apr. 23, 2004

(65) Prior Publication Data

US 2005/0010841 A1 Jan. 13, 2005

(30) Foreign Application Priority Data

Jul. 11, 2003 (KR) .................. 10-2003-0047402

(51) Int. Cl.
*G11C 29/04* (2006.01)
*G11C 29/48* (2006.01)

(52) U.S. Cl. ..................................... 714/718
(58) Field of Classification Search ............. 714/718, 714/719; 365/201
See application file for complete search history.

(56) References Cited

U.S. PATENT DOCUMENTS 6,421,291 B1 * 7/2002 Watanabe et al. ........... 365/219

* cited by examiner

*Primary Examiner*—James C Kerveros
(74) *Attorney, Agent, or Firm*—F. Chau & Associates, LLC

(57) ABSTRACT

A memory module, including a plurality of semiconductor memory devices for writing and reading m-bit parallel data; and a buffer for converting n-bit serial data into the m-bit parallel data to output to the plurality of semiconductor memory devices, converting the m-bit parallel data into the n-bit serial data to output to a first external portion during a normal operation, buffering 2n-bit parallel data to output to the plurality of semiconductor memory devices, and buffering the m-bit parallel data to output to a second external portion during a test operation.

12 Claims, 4 Drawing Sheets

MEMORY MODULE AND METHOD OF TESTING THE SAME

CROSS-REFERENCE TO RELATED APPLICATION

This application claims priority to Korean Patent Application No. 2003-47402, filed Jul. 11, 2003, the disclosure of which is incorporated herein by reference.

BACKGROUND OF THE INVENTION

1. Technical Field

The present invention relates to a memory module and, more particularly, to a memory module having memory devices and a method of testing the same.

2. Discussion of the Related Art

A typical memory system includes a memory control circuit and a plurality of memory modules. Each of the plurality of memory modules includes a plurality of semiconductor memory devices. The plurality of semiconductor memory devices are connected to a plurality of data lines, which in turn connect to the memory control circuit.

As operating speeds of typical memory systems increase, a memory module has been proposed, which includes a buffer device for transmitting data between the memory control circuit and the plurality of memory modules at high speeds.

FIG. 1 is a block diagram illustrating a conventional memory system including such a buffer device. The memory system of FIG. 1 includes a memory module 100 and a memory control circuit 200. The memory module 100 includes dynamic random access memories (DRAMs) 20-1–20-8 and a buffer device 10. An operation of the memory system of FIG. 1 will be discussed below.

The memory control circuit 200 transmits differential serial data to the buffer device 10 and receives differential serial data transmitted from the buffer device 10. The buffer device 10 multiplexes the differential serial data transmitted from the memory control circuit 200, converts the differential serial data into single parallel data, and transmits the single parallel data to the DRAMs 20-1–20-8 during a write operation. The buffer device 10 also demultiplexes the single parallel data received from the DRAMs 20-1–20-8, converts the single parallel data into differential serial data, and transmits the differential serial data to the memory control circuit 200 during a read operation. Each of the DRAMs 20-1–20-8 stores the single parallel data transmitted from the buffer device 10 during a write operation and outputs the single parallel data to the buffer device 10 during a read operation.

Differential serial data is data associated with a predetermined bit of parallel data that was serially input to the buffer device 10, and bits of the differential serial data are in pairs having "high" levels and "low" levels. Single parallel data is a predetermined bit of parallel data and bits of the single parallel data have either a "high" level or a "low" level. The differential serial data is smaller in bit number than the single parallel data.

FIG. 2 is a block diagram illustrating the buffer device 10 of the conventional memory system of FIG. 1. The buffer device 10 includes a multiplexer 11, demultiplexer 12, differential input buffer 15, differential output buffer 16, input buffer 13 and output buffer 14. An operation of the buffer device 10 will be discussed below.

The multiplexer 11 converts n-bits of differential serial data into parallel to generate m-bits of single parallel data. For example, when "n" is 16 and "m" is 8, the multiplexer 11 serially receives differential serial data of 2-bits four times to generate single parallel data having 8-bits. In other words, 2-bit differential serial data is serially input four times to the multiplexer 11 and converted into single parallel data having 8-bits.

The demultiplexer 12 converts m-bits of single parallel data into serial to generate n-bits of differential serial data. For example, when "n" is 16 and "m" is 8, the demultiplexer 12 converts single parallel data having 8-bits into 2-bit serial data, which is then serially output four times. In other words, 8-bit single parallel data is serially converted into 2-bit data that is serially output four times.

The differential input buffer 15 buffers n-bits of differential serial data output from the memory control circuit 200 and outputs buffered differential serial data to the multiplexer 11. The differential output buffer 16 buffers n-bits of differential serial data output from the demultiplexer 12 and outputs the buffered differential serial data to the memory control circuit 200.

The input buffer 13 buffers data having 8 m-bits output from the multiplexer 11 and transmits the buffered data to corresponding DRAMs 20-1–20-8. The output buffer 14 buffers data having 8 m-bits output from corresponding DRAMs 20-1–20-8 and transmits the buffered data to the demultiplexer 12.

As described above, the conventional memory system serially transmits 2-bit data between the memory control circuit 200 and the buffer device 10 and transmits differential serial data in order to reduce a common mode noise during data transmission. Here, a data rate between the buffer device 10 and the DRAMs 20-1–20-8 is higher than a data rate between the memory control circuit 200 and the buffer device 10 when transmitting data at high speed. Thus, as data is serially transmitted between the memory control circuit 200 and the buffer device 10, the number of data lines is reduced, and a data rate is increased to transmit data at high speed.

However, in the conventional memory system it is difficult to test the semiconductor memory devices of the memory module to see if they are operating properly. This occurs, because when the frequency of a clock signal applied by a tester is lower than the frequency of a clock signal used by the memory control circuit, it is difficult to perform a test, and it is difficult to apply a test pattern to the buffer device.

SUMMARY OF THE INVENTION

In one embodiment of the present invention, a memory module comprises: a plurality of semiconductor memory devices for writing and reading m-bit parallel data; and a buffer for converting n-bit serial data into the m-bit single parallel data to output to the plurality of semiconductor memory devices, converting the m-bit parallel data into the n-bit serial data to output to a first external portion during a normal operation, buffering 2n-bit parallel data to output to the plurality of semiconductor memory devices, and buffering the m-bit parallel data to output to a second external portion during a test operation. The n-bit serial data and the 2n-bit parallel data are applied by a memory control unit and a test unit, respectively. The first external portion is a memory control unit and the second external portion is a test unit.

In another embodiment of the present invention, the buffer comprises: a multiplexer for converting the n-bit serial data into the m-bit parallel data to output to the plurality of semiconductor memory devices during a write operation of the normal operation; a demultiplexer for converting the m-bit parallel data into the n-bit serial data to output to the first external portion during a read operation of the normal operation; an input buffer for buffering the 2n-bit parallel data to output to the plurality of semiconductor memory devices during a write operation of the test operation; and an output buffer for buffering the m-bit parallel data to output to the second external portion during a read operation of the test operation.

During the test operation of the present invention, when the number of the semiconductor memory devices is k, and 2n is smaller than km, the buffer divides the k semiconductor memory devices into two or more groups and buffers and receives two or more of the m-bit parallel data input from the semiconductor memory devices of each of the two or more groups, and buffers and outputs two or more of the m-bit parallel data output from the semiconductor memory devices of each of the two or more groups among the k semiconductor memory devices, wherein k, m and n are natural numbers.

In yet another embodiment of the present invention, a method of testing a memory module comprising a plurality of semiconductor memory devices for writing and reading m-bit parallel data, and a buffer, the method comprises: converting n-bit serial data into m-bit parallel data to output to the plurality of semiconductor memory devices, converting the m-bit parallel data into the n-bit serial data to output to a first external portion, during a normal operation, buffering 2n-bit parallel data to output to the plurality of semiconductor memory devices during a write operation of a test operation; and buffering the m-bit parallel data to output to a second external portion during a read operation of a test operation.

In another embodiment of the present invention, when the number of the semiconductor memory devices is k and 2n is smaller than km, dividing the k semiconductor memory devices into two or more groups; buffering and receiving two or more of the m-bit parallel data input from the semiconductor memory devices of the two or more groups; and buffering and outputting two or more of the m-bit parallel data output from the semiconductor memory devices of each of the two or more groups among the k semiconductor memory devices.

In yet another embodiment of the present invention, the serial data comprises a pair of bits having a "high" level and a "low" level that are associated with a bit of parallel data to be applied to the plurality of semiconductor memory devices, wherein the bit of parallel data is serially applied. The parallel data is data that has a "high" level or a "low" level and is applied in parallel. The serial data is differential serial data.

BRIEF DESCRIPTION OF THE DRAWINGS

The features of the present invention will become more apparent to those of ordinary skill in the art by describing in detail exemplary embodiments thereof with reference to the attached drawings, in which.

DETAILED DESCRIPTION OF EXEMPLARY EMBODIMENTS

Figure 1:
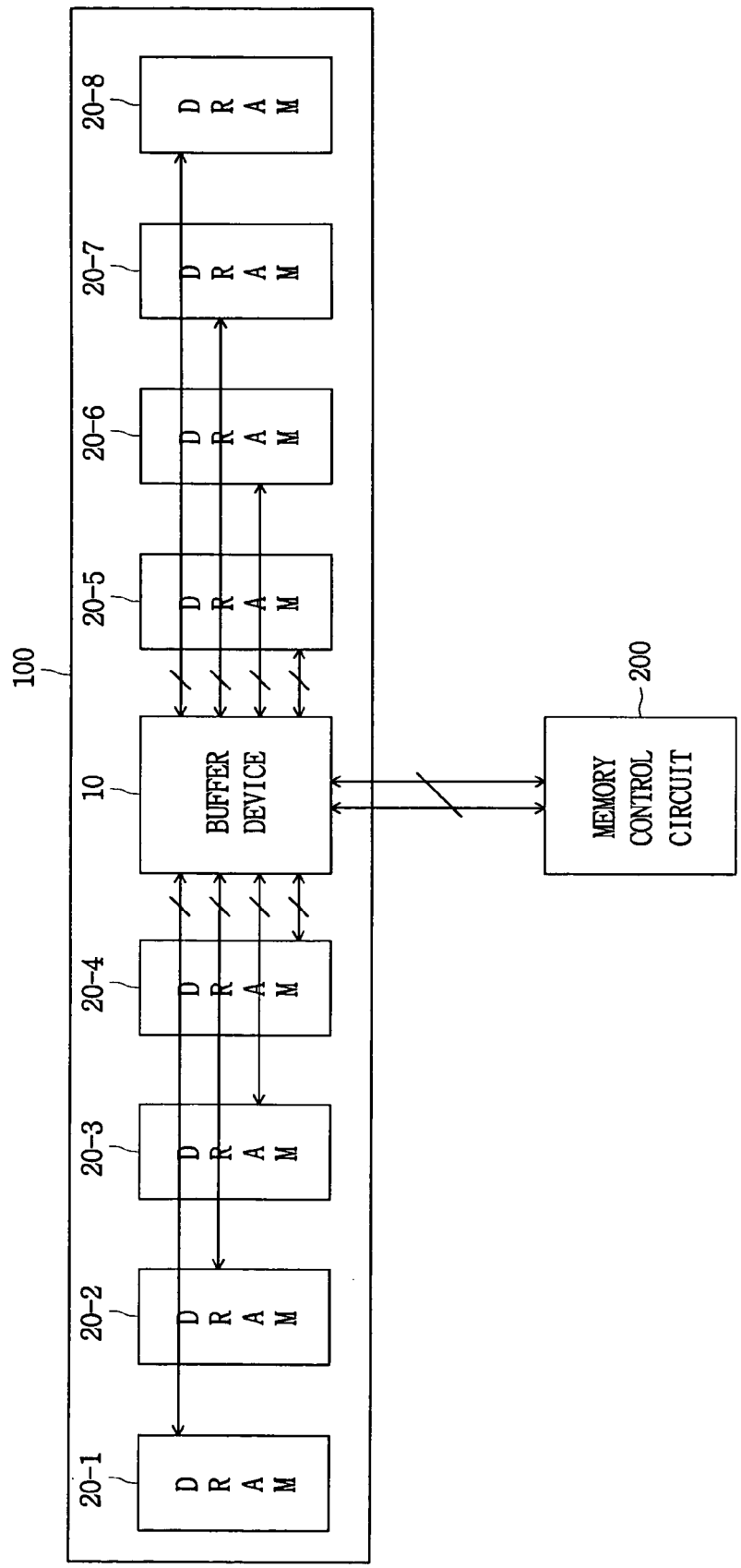
FIG. 1 is a block diagram illustrating a conventional memory system.
Figure 2:
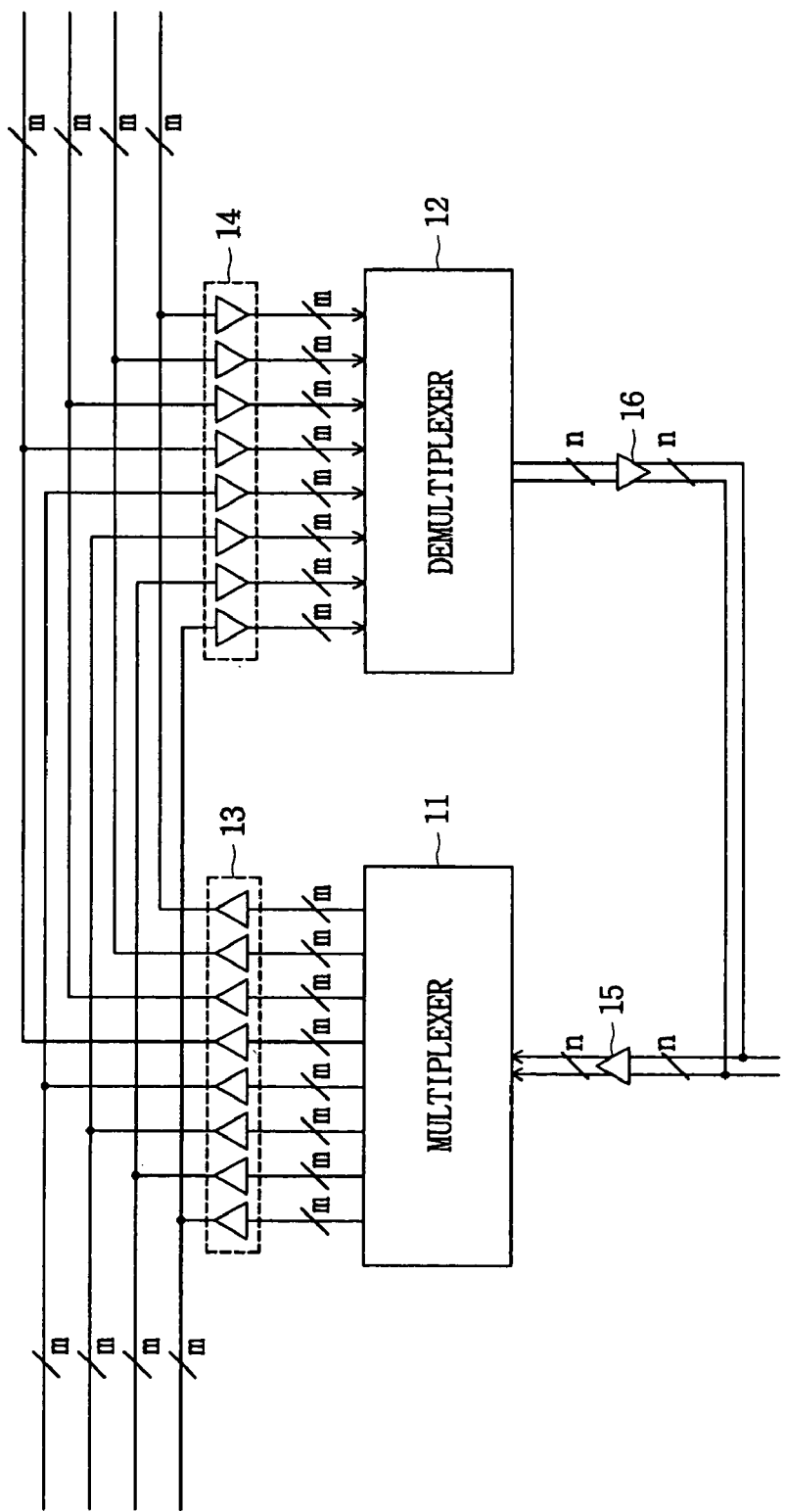
FIG. 2 is a block diagram illustrating a buffer device of the conventional memory system of FIG. 1.
Figure 3:
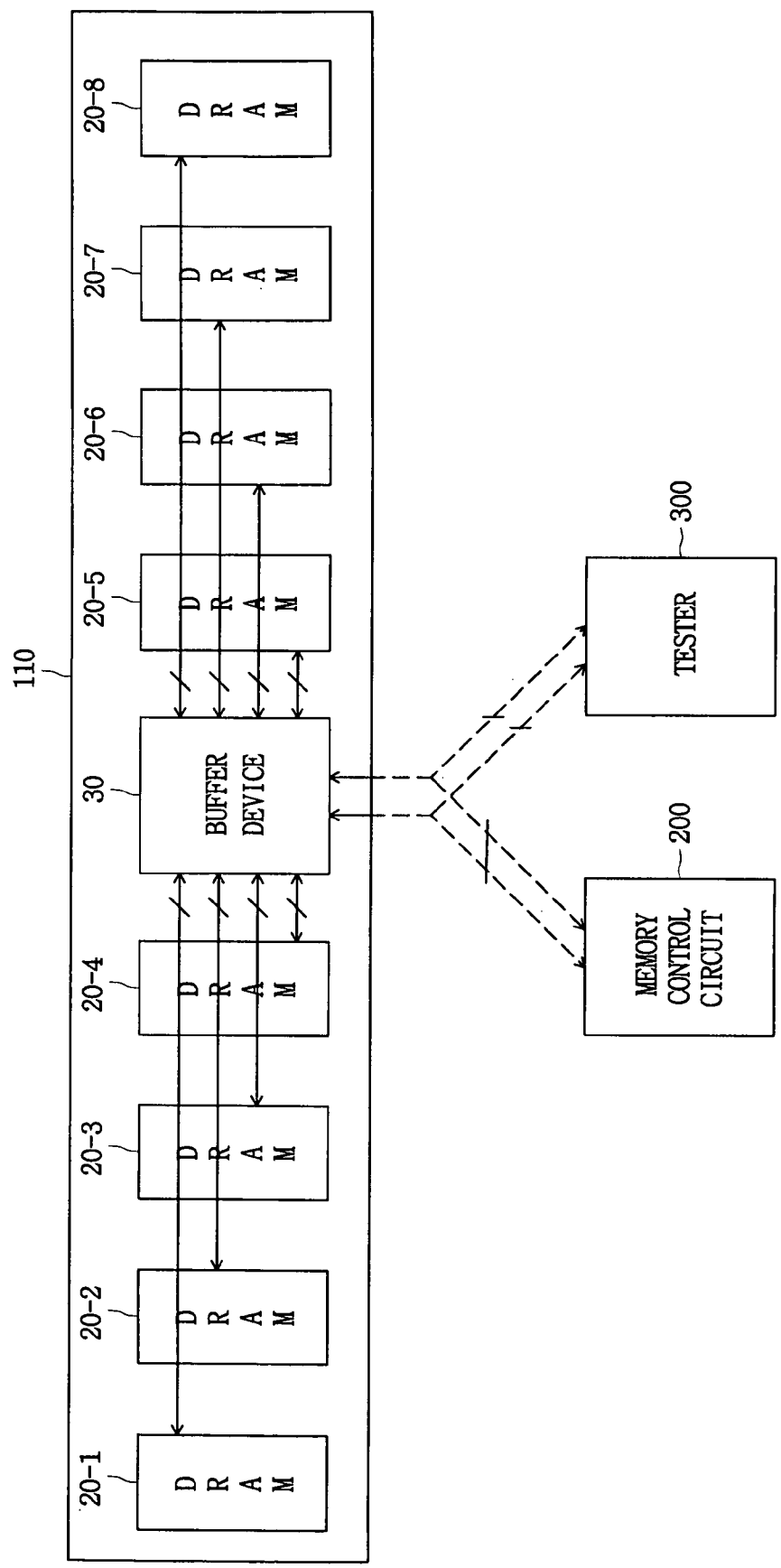
FIG. 3 is a block diagram illustrating a memory module according to an exemplary embodiment of the present invention.

FIG. 3 is a block diagram illustrating a memory module 110 according to an exemplary embodiment of the present invention. The memory module 110 includes a buffer device 30 and dynamic random access memories (DRAMs) 20-1–20-8. The memory module 110 is connected to a memory control circuit 200 when used, for example, in a conventional memory system and is connected to a tester 300 when tested. An operation of the memory module 110 will be discussed below.

The memory module 110 receives differential serial data when connected to the memory control circuit 200 and single parallel data when connected to the tester 300. When operated, the buffer device 30 receives the differential serial data and converts it into single parallel data to output to the DRAMs 20-1–20-8.

When tested, the buffer device 30 receives and buffers single parallel data applied from the tester 300 and outputs the buffered single parallel data to the DRAMs 20-1–20-8. In other words, the memory module 110 transmits the differential serial data at a high speed when it receives/outputs data from/to the memory control circuit 200 and transmits the single parallel data at a low speed when it receives/outputs data from/to the tester 300. Therefore, the buffer device 30 of the memory module 110 can be tested by using a conventional tester.

Figure 4:
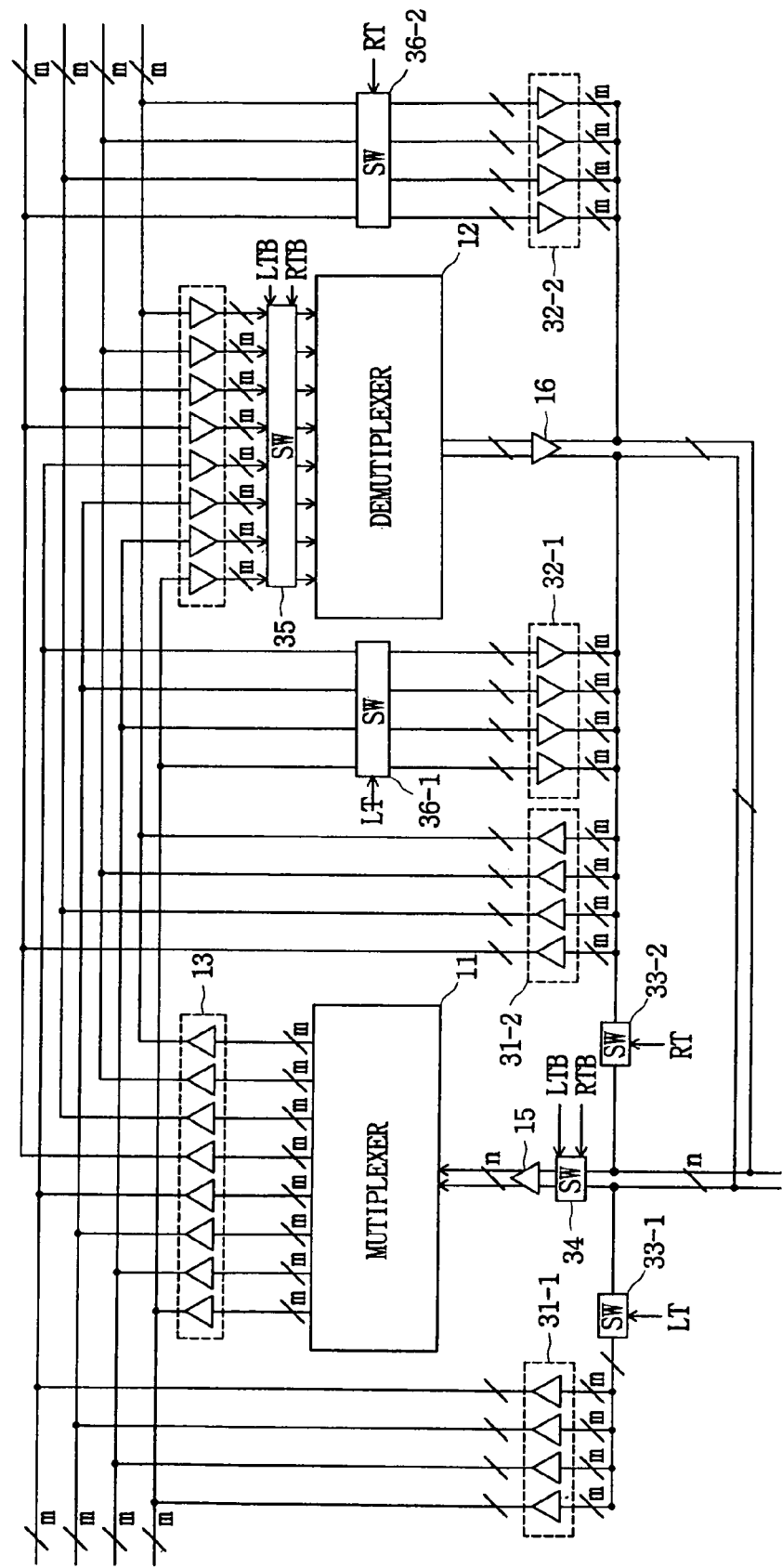
FIG. 4 is a circuit diagram illustrating a buffer device according to an exemplary embodiment of the present invention.

FIG. 4 is a circuit diagram illustrating the buffer device 30 according to an exemplary embodiment of the present invention. The buffer device 30 includes input buffers 31-1 and 31-2, input control switches SW 33-1, 33-2 and 34, output buffers 32-1 and 32-2, and output control switches 35, 36-1 and 36-2. The buffer device 30 has the DRAMs 20-1–20-4 on its left side and the DRAMs 20-5–20-8 on its right side (similar to the arrangement in FIG. 3) and are separately tested as 2n data lines are fewer than 8m data lines.

As shown in FIG. 4, LT, RT, LTB, and RTB denote test signals. LTB is an inverted signal of LT, and RTB is an inverted signal of RT. The test signals LT and RT are generated by decoding command signals applied from the tester 300. The test signal LT is used to test the DRAMs 20-1–20-4 and the test signal RT is used to test the DRAMs 20-5–20-8. An operation of the buffer device 30 will be discussed below.

When the test signals LT and RT are at a "low" level and the inverted test signals LTB and RTB are at a "high" level, the input control switches 33-1 and 33-2 and the output control switches 36-1 and 36-2 are turned off, and the input control switch 34 and the output control switch 35 are turned on.

When the test signals LT, RT, LTB and RTB and the switches 33-1, 33-2, 34, 35, 36-1 and 36-2 are in the above configuration, during a write operation, when the differential serial data is input from the memory control circuit 200, the multiplexer 11 converts n pairs of differential serial data into 8 m-bit single parallel data and outputs the converted data to the DRAMs 20-1–20-8. During a read operation, when m-bit single parallel data is input to the DRAMs 20-1–20-8, the demultiplexer 12 converts the 8 m-bit single parallel data into n pairs of differential serial data and outputs the converted data to the memory control circuit 200.

When the test signals LT and RT are at a "high" level and a "low" level and the inverted test signals LTB and RTB are at a "low" level and a "high" level, respectively, the input control switch 33-1 and the output control switch 36-1 are turned on, and the input control switches 33-2 and 34 and the output control switches 35 and 36-2 are turned off.

In this signal and switch configuration, during a write operation, when 2n-bit single parallel data is input from the tester 300, the 2n-bit single parallel data is transmitted through the input control switch 33-1. The input buffer 31-1 buffers the 2n-bit single parallel data transmitted through the switch 33-1 and outputs the buffered 4 m-bit data to the DRAMs 20-1–20-4. It is to be understood that when n is 16 and m is 8, the tester 300 generates four 8-bit single parallel data streams to be input to the DRAMs 20-1–20-4 through 32 data lines. Thus, four 8-bit single parallel data streams are written to the DRAMs 20-1–20-4 through the input buffer 31-1.

During a read operation, four m-bit single parallel data output from the DRAMs 20-1–20-4 are transmitted through the switch 36-1. The output buffer 32-1 buffers the four m-bit single parallel data transmitted through the switch 36-1 and transmits the four m-bit single parallel data buffered to the tester 300 through 2n data lines. For example, when n is 16 and m is 8, four 8-bit single parallel data streams are output from the DRAMs 20-1–20-4. Thus, four 8-bit single parallel data streams are output to the switch 36-1 and the output buffer 32-1. Here, the 32-bit data output are transmitted to the tester 300 through 32 data lines. Accordingly, the DRAMs 20-1–20-4 of the memory module 110 are tested.

When the test signals LT and RT are at a "low" level and a "high" level and the inverted test signals LTB and RTB are at a "high" level and a "low" level, the input control switch 33-2 and the output control switch 36-2 are turned on, and the input control switches 33-1 and 34 and the output control switches 35 and 36-1 are turned off.

In this state, during a write operation, when 2n-bit single parallel data is input from the tester 300, the 2n-bit single parallel data is transmitted through the input control switch 33-2. The input buffer 31-2 buffers the 2n-bit single parallel data transmitted through the switch 33-2 and outputs buffered four m-bit data to the DRAMs 20-5–20-8. During a read operation, four m-bit single parallel data output from the DRAMs 20-5–20-8 are transmitted through the switch 36-2. The output buffer 32-2 buffers the four m-bit single parallel data transmitted through the switch 36-2 and outputs the 4 m-bit single parallel data to the tester 300 through 2n data lines. Accordingly, the DRAMs 20-5–20-8 of the memory module 110 are tested.

As described above with reference to FIGS. 3 and 4, during a test operation, the memory module 110 writes the single parallel data to the DRAMs 20-1–20-8 from the tester 300 "as is" and outputs the single parallel data from the DRAMs 20-1–20-8 to the tester 300 "as is". Therefore, test pattern data to be applied from the tester 300 does not have to be processed as the tester 300 receives the test pattern data applied from the DRAMs 20-1–20-8 "as is". In addition, when the tester 300 cannot apply data at high speed to test the memory module 110, a test can be performed by the buffer device 30.

It should also be understood that the DRAMs 20-1–20-8 of the memory module 110 are separately tested but can be tested simultaneously or can be divided into additional groups to be tested. For example, when n is 16 and m is 4, eight DRAMs can be simultaneously tested, and when n is 16 and m is 16, two DRAMs can be tested four times.

In an alternative embodiment of the present invention, sundry semiconductor memory devices, for example, static RAMs (SRAMs), flash RAMs, etc., can be mounted on the memory module 110 in place of DRAMs (e.g., DRAMs 20-1–20-8).

As discussed above, the memory module 110 and the method of testing the same enable tests to be performed on the memory module 110 using a common tester, which does not have to configure a separate test pattern data to test the semiconductor memory devices (e.g., DRAMs 20-1–20-8) of the memory module 110.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A memory module, comprising:
   a plurality of semiconductor memory devices for writing and reading m-bit single parallel data; and
   a buffer for converting n-bit differential serial data receive from a first external portion into a plurality of the m-bit single parallel data to output to the plurality of semiconductor memory devices during a normal write operation,
   converting the plurality of m-bit single parallel data received from the plurality of semiconductor memory devices into the n-bit differential serial data to output to the first external portion during a normal read operation,
   buffering 2n-bit single parallel data received from a second external portion to output to the plurality of semiconductor memory devices during a test write operation, and
   buffering the plurality of m-bit single parallel data received from the plurality of semiconductor memory devices to output to the second external portion during a test read operation.

2. The module of claim 1, wherein each bit of the differential serial data is a pair of differential bits having a "high level" and "low level" and the differential serial data are applied in serial.

3. The module of claim 1, wherein the parallel data has on of a "high" level and a "low" level and is applied in parallel.

4. The module of claim 1, wherein the buffer comprises:
   a multiplexer for converting the n-bit differential serial data received from the first external portion into the plurality of m-bit single parallel data to output to the plurality of semiconductor memory devices during the normal write operation;
   a demultiplexer for converting the plurality of m-bit single parallel data received from the plurality of semiconductor memory devices into the n-bit differential serial data to output to the first external portion during the normal read operation;
   an input buffer for buffering the 2n-bit single parallel data received from the second external portion to output to the plurality of semiconductor memory devices during the test write operation; and
   an output buffer for buffering the plurality of m-bit single parallel data received from the plurality of semiconductor memory devices to output to the second external portion during the test read operation.

5. The module of claim 4, wherein during the test operation, when the number of the semiconductor memory devices is k, and 2n is smaller than km, the buffer divides the k semiconductor memory devices into two or more groups and buffers and receives two or more of the m-bit parallel data input from the semiconductor memory devices of each of the two or more groups, and buffers and outputs two or more of the m-bit parallel data output from the semiconductor memory devices of each of the two or more groups among the k semiconductor memory devices.

6. The module of claim 5, wherein k, m and n are natural numbers.

7. The module of claim 1, wherein the first external portion is a memory control unit and the second external portion is a test unit.

8. A method of testing a memory module comprising a plurality of semiconductor memory devices for writing and reading m-bit single parallel data, and a buffer, the method comprising:
   converting n-bit differential serial data received from a first external portion into a plurality of the m-bit single parallel data to output to the plurality of semiconductor devices during a normal operation;
   converting the plurality of m-bit single parallel data received from the plurality of semiconductor memory devices into the n-bit differential serial data to output to the first external portion during the normal operation;
   buffering 2n-bit single parallel data received from a second external portion to output to the plurality of semiconductor memory devices during a test operation; and
   buffering the plurality of m-bit single parallel data received, from the plurality of semiconductor memory devices to output to the second external portion during the test operation.

9. The method of claim 8, wherein each bit of the differential serial data is a pair of differential bits having a "high level" and a "low level" and the differential serial data is applied in serial.

10. The method of claim 8, wherein the parallel data has one of a "high" level and a "low" level and is applied in parallel.

11. The method of claim 8, further comprising, when the number of the semiconductor memory devices is k and 2n is smaller thin km,
   dividing the k semiconductor memory devices into two or more groups;
   buffering and receiving two or more of the m-bit single parallel data input from the semiconductor memory devices of the two or more groups; and
   buffering and outputting two or more of the m-bit single parallel data output from the semiconductor memory devices of each of the two or more groups among the k semiconductor memory devices,
   wherein k, m and n are natural numbers.

12. The method of claim 8, wherein converting the n-bit differential serial data into the plurality of m-bit single parallel data occurs during a write operation of the normal operation;
   converting the plurality of m-bit single parallel data into the n-bit differential serial data occurs during a read operation of the normal operation;
   buffering the 2n-bit single parallel data occurs during a write operation of the test operation; and
   buffering the plurality of m-bit single parallel data occurs during a read operation of the test operation.

* * * * *